US008338251B2

(12) United States Patent
Berthold et al.

(10) Patent No.: US 8,338,251 B2
(45) Date of Patent: Dec. 25, 2012

(54) METHOD OF MANUFACTURE TRANSISTOR WITH REDUCED CHARGE CARRIER MOBILITY

(75) Inventors: Joerg Berthold, Munich (DE); Christian Pacha, Neukeferloh (DE); Klaus von Arnim, Munich (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 13/472,514

(22) Filed: May 16, 2012

(65) Prior Publication Data
US 2012/0224415 A1 Sep. 6, 2012

Related U.S. Application Data

(60) Division of application No. 13/072,805, filed on Mar. 28, 2011, now Pat. No. 8,183,636, which is a continuation of application No. 11/764,500, filed on Jun. 18, 2007, now Pat. No. 7,915,681.

(51) Int. Cl.
*H01L 21/336* (2006.01)

(52) U.S. Cl. .. 438/257; 438/258; 438/593; 438/E21.442

(58) Field of Classification Search .......... 438/152–153, 438/238, 257–258, 593
See application file for complete search history.

(56) References Cited

U.S. PATENT DOCUMENTS

| 6,974,983 B1 * | 12/2005 | Hill et al. ............... 257/292 |
| 2012/0199909 A1 * | 8/2012 | Schulz et al. ............ 257/351 |

* cited by examiner

*Primary Examiner* — Dung A. Le
(74) *Attorney, Agent, or Firm* — Infineon Techn. AG; Philip H Schlazer

(57) ABSTRACT

One or more embodiments of the invention relate to a method comprising: treating a fin of a first n-channel access transistor in a static random access memory cell to have a lower charge carrier mobility than a fin of a first n-channel pull-down transistor in a first inverter in the memory cell, the first n-channel access transistor being coupled between a first bit line and a first node of the first inverter; and treating a fin of a second n-channel access transistor in the memory cell to have a lower charge carrier mobility than a fin of a second n-channel pull-down transistor in a second inverter in the memory cell, the second n-channel access transistor being coupled between a second bit line and a second node of the second inverter.

10 Claims, 5 Drawing Sheets

METHOD OF MANUFACTURE TRANSISTOR
WITH REDUCED CHARGE CARRIER
MOBILITY

RELATED APPLICATION INFORMATION

This application is a divisional application of U.S. patent application Ser. No. 13/072,805, filed on Mar. 28, 2011, which is a continuation application of U.S. patent application Ser. No. 11/764,500, filed on Jun. 18, 2007, which is now U.S. Pat. No. 7,915,681. U.S. patent application Ser. No. 11/764,500 and U.S. patent application Ser. No. 13/072,805 are both hereby incorporated by reference herein.

TECHNICAL FIELD

The subject matter relates generally to transistors with reduced charge carrier mobility and associated treatment methods in connection with such transistors.

BACKGROUND

Fin field-effect transistor (FinFET) structures are one of the options for future complementary metal oxide semiconductor (CMOS) technologies. There is a need for improved FinFET structures and methods.

DETAILED DESCRIPTION

Figure 1:
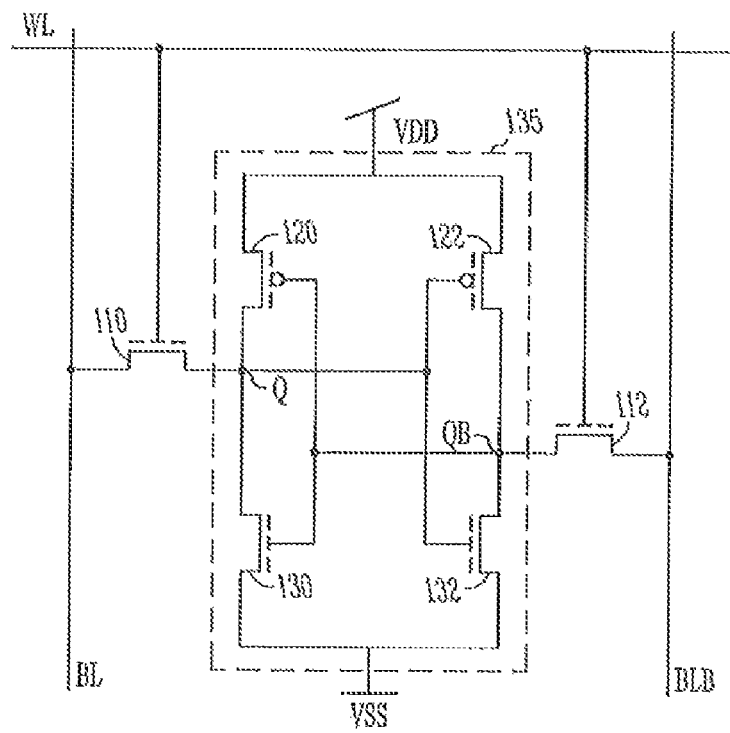
FIG. 1 illustrates an electrical schematic diagram of a static random access memory (SRAM) cell according to various embodiments.

The various embodiments described herein are merely illustrative. Therefore, the various embodiments shown should not be considered as limiting of the claims.

Fin field-effect transistor (FinFET) structures are one of the options for future complementary metal oxide semiconductor (CMOS) technologies. P-type FinFETs have a similar performance to n-type FinFETs for many circuit arrangements. This is mainly due to a crystal orientation along sidewall channels, which yields a higher mobility for holes. There are, however, some circuit types that are difficult to implement with strong p-type transistors. An example is a static random access memory (SRAM) cell, where certain current/performance ratios between pull-down, access, and load transistors are required.

One of the characteristic features of FinFETs is a discretization of the effective transistor width imposed by a constant fin height. If, e.g. in a SRAM, the area has to be kept as small as possible, this discretization feature could lead to larger areas: the smaller area is possible when all transistors, the slowest or weakest transistors and the fastest or strongest transistors, are implemented using one fin. But, because of the discretization feature, the required performance ratios of the access, pull-down, and load transistors of a SRAM cell demand either a 2-fin implementation of a fast or strong transistor, or a longer gate electrode of the weak transistor. Both options result in an increase in area and power dissipation.

FinFETs of both types can gain performance through use of fins that are left un-doped. In advanced FinFETs, the threshold voltage is adjusted by choosing an appropriate gate material. The charge carriers are subjected to less scattering with undoped fins, and this results in an improved mobility and in a higher drain current.

The mobility mechanism allows an adjustment of FinFET performance by intentionally reducing the charge carrier mobility with selective fin doping. FinFETs that are too strong are doped with one or more additional implantations. The increased scattering of holes and electrons leads to a decreased mobility and a correspondingly lower current. One of the two main advantages of FinFET technology, the mobility improvement due to un-doped fins, is sacrificed with the doping.

Any undesired change of the threshold voltage of a FinFET due to the introduction of dopants can be reduced by counter-doping the fin using a dopant species of the opposite polarity according to various embodiments. In FinFET technology that relies on fin doping, the mobility can be reduced by using a higher dose, also called an excess dose, than required for a threshold voltage adjustment, followed by a counter-doping implantation. The counter-doping implantation occurs with a dose corresponding to the dose of the first implantation.

Doping refers to the incorporation of electrically active species into a semiconductor lattice, a process including implantation and anneal operations. The scattering increase of the charge carrier is then caused, for example, by the local strain due to a size mismatch in the lattice. The mobility can also be reduced according to various embodiments by introducing interstitials and damage to result in, for example, electrically non-active scatter centers. According to various embodiments, other electrically non-active materials like germanium (Ge) or carbon (C) can be incorporated in a channel region of a FinFET.

Another way to reduce the mobility according to various embodiments is to introduce additional surface states. This can be done also by implants damaging the surface of the FinFET or by introducing additional process steps or by omitting process steps in a region of a SRAM.

In a FinFET technology that uses un-doped fins, one or more fins receive a selective implantation according to various embodiments. The selective implantation depends on the purpose of the fins within a circuit to achieve a selective reduction of a drive current. The implantation dose depends on the required performance modification. Both types of dopant species can be introduced in one or more implantations according to various embodiments to reduce side effects on the threshold voltage of a FinFET, and this is called counter-doping.

FIG. 1 illustrates an electrical schematic diagram of a SRAM cell 100 according to various embodiments. A pair of n-type access transistors 110 and 112 have gates coupled to a word line (WL), and drains respectively coupled to a bit line (BL) and complementary bit line (BLB). A pair of p-type load transistors 120 and 122 and a pair of n-type pull-down transistors 130 and 132 are coupled to form a pair of cross coupled inverters indicated by broken line 135. The transistors 120, 130 are coupled to be a first inverter, and the transistors 122, 132 are coupled to be a second inverter. The transistors 120, 122 are coupled to a supply voltage VDD, and the transistors 130, 132 are coupled to a ground voltage VSS. Drains of the transistors 120, 130 are coupled together at a node Q to a source of the access transistor 110 and to gates of the transistors 122, 132. Similarly, drains of the transistors 122, 132 are coupled together at a complementary node QB to a source of the access transistor 112 and to gates of the transistors 120, 130. Potentials at the nodes Q and QB indicate data held by the SRAM cell 100.

The SRAM cell 100 is read in the following manner Assume that the data held by the SRAM cell 100 is a 1, stored as VDD at Q and VSS at QB. The transistors 120, 132 are switched on, and the transistors 122, 130 are switched off. A read cycle begins when both BL and BLB are charged to a high potential. WL is then asserted, enabling both of the access transistors 110, 112. The respective potentials at the nodes Q and QB are then coupled to BL and BLB. BLB is discharged through the transistors 112 and 132 to VSS. On the node Q side, the transistors 120 and 110 pull BL towards VDD. If the data held by the SRAM cell 100 is a 0, this data would be stored as VDD at QB and VSS at Q, and a read cycle would result in the opposite behavior as BLB would be pulled towards VDD and BL towards VSS.

The SRAM cell 100 is written to in the following manner. A write cycle is begun by applying the value to be written to BLB and BL. To write a 0, BLB is charged to a high potential and BL is discharged. To write a 1, BL is charged to a high potential and BLB is discharged. WL is then asserted to enable the access transistors 110, 112 and the cross coupled inverters latch the potentials on BL and BLB.

If WL is not asserted, the access transistors 110, 112 substantially isolate the SRAM cell 100 from BL and BLB, and the cross coupled inverters formed by the transistors 120, 122, 130, and 132 reinforce each other.

Two requirements regarding the relative characteristics of the transistors 110, 112, 120, 122, 130, and 132 must be met for a proper operation of the SRAM cell 100. During a read operation when the SRAM cell 100 stores the data 1 with Q at VDD and QB at VSS, the potential of QB should stay close to VSS even when BLB is pre-charged to VDD and the access transistor 112 between QB and BLB is switched on. In this case, the access transistor 112 has to be weaker than the pull-down transistor 132, as both are coupled to QB. During a write operation to change the data stored by the SRAM cell 100 from 1 to 0, the two cross-coupled inverters must be transferred from one stable state where Q is at VDD and QB is at VSS into a second stable state where Q is at VSS and QB is at VDD. Since the access transistors 110,112 pass only the potential VSS or VDD less their respective threshold voltages, the load transistors 120, 122 must be weaker than the respective pull-down transistors 130, 132.

Figure 2:
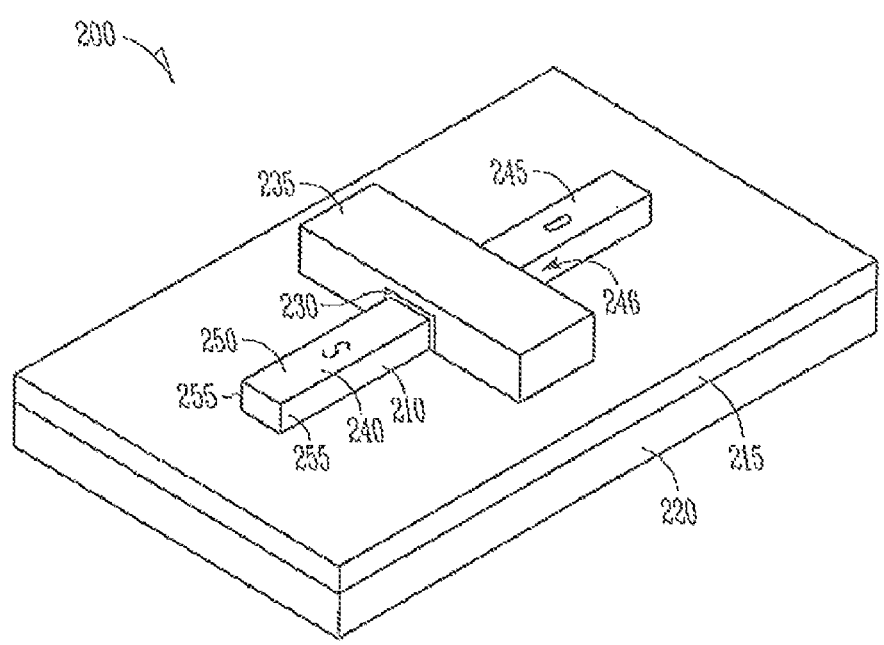
FIG. 2 illustrates a block perspective diagram of a fin field effect transistor according to various embodiments.

FIG. 2 illustrates a block perspective diagram of a fin field effect transistor 200 according to various embodiments. The transistor 200 has a body, also referred to as a fin 210, and is referred to as a single fin transistor. The fin 210 is formed of a semiconductor material and may be formed on an insulating surface 215 over a substrate 220. The insulating surface 215 may be an oxide such as a buried oxide and the substrate 220 may be silicon or another semiconductor material. A gate dielectric 230 is formed over the top and on the sides of the fin 210. A gate electrode 235 is formed over the top and on the sides of the gate dielectric 230 and may include a metal layer. Source 240 and drain 245 regions may be formed in the fin 210 on either side of the gate electrode 235, and may be laterally expanded to be significantly larger than the fin 210 under the gate electrode 235 according to various embodiments. A channel region 246 may be located in the fin 210 between the source region 240 and the drain region 245 and under the gate electrode 235. The transistor 200 may be a p-channel transistor or an n-channel transistor. The fin 210 has a top surface 250 and laterally opposite sidewalls 255. The fin 210 has a height or thickness from the insulating surface 215 and a width. Both the width and height may be uniform or may change between the source region 240 and the drain region 245. According to various embodiments, the transistor 200 is a high-k/metal-gate transistor, where the gate dielectric 230 includes a high-k dielectric and the gate electrode 235 includes a metal.

Figure 3:
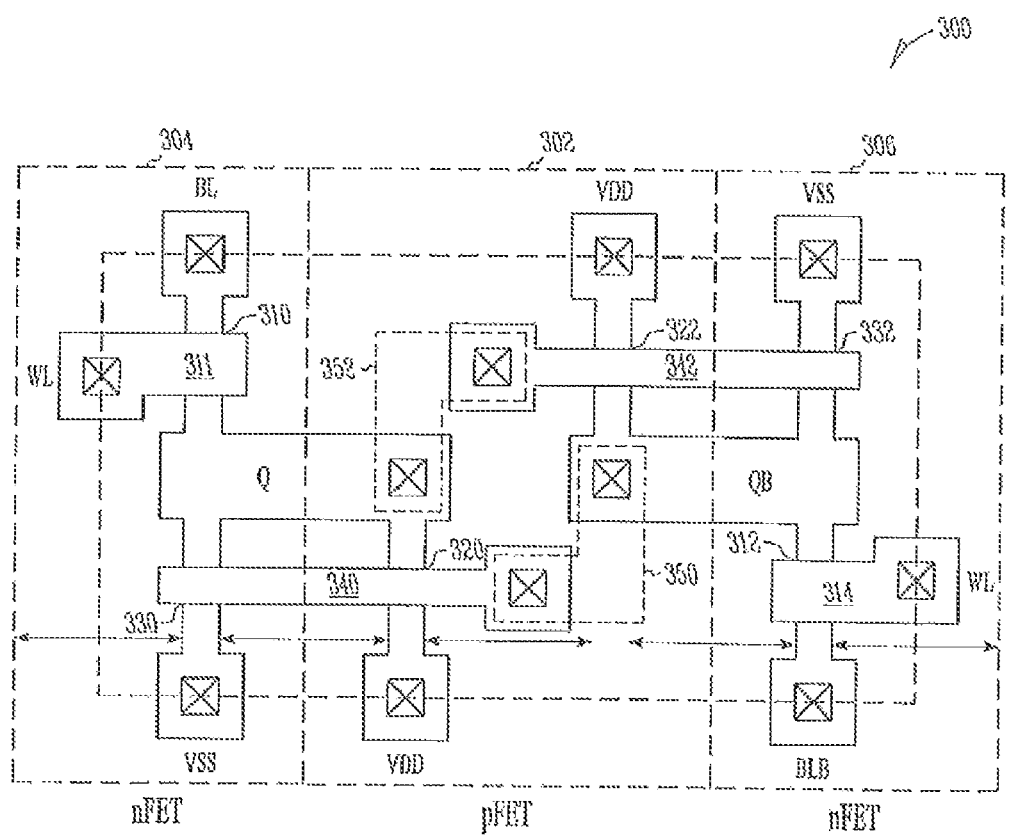
FIG. 3 illustrates a layout of a SRAM cell according to various embodiments.

FIG. 3 illustrates a layout of a SRAM cell 300 according to various embodiments. The SRAM cell 300 has the same arrangement of transistors as the SRAM cell 100 shown in FIG. 1. The SRAM cell 300 includes single fin field effect transistors formed of semiconductor material that may be formed on an insulating surface over a substrate (not shown). The single fin transistors in the SRAM cell 300 each have a source region, a drain region, and a channel region in a fin, and a gate dielectric and a gate electrode similar to the corresponding elements in the transistor 200 shown in FIG. 2. According to various embodiments, one or more of the transistors in the SRAM cell 300 may have a plurality of fins. P-channel transistors are contained in an area 302 defined by a broken line, and re-channel transistors are contained in two areas 304 and 306 defined by broken lines on either side of the area 302. The layout of the SRAM cell 300 may be repeated in a pattern to represent a layout of an array of SRAM cells, and the array may include shared terminals coupled to VDD for adjacent SRAM cells, and separate columns of n-type transistors and p-type transistors. Transistors are identified with reference numbers pointing to their channels. Contacts are identified by an "x", and may be coupled to one of WL, BL, BLB, VSS, and VDD.

A pair of n-type access transistors 310, 312 have respective gate electrodes 311, 314 coupled to a word line WL, and drains respectively coupled to a bit line BL and complementary bit line BLB. A pair of p-type pull-up transistors 320, 322 and a pair of n-type pull-down transistors 330, 332 are coupled to form a pair of cross coupled inverters. The transistors 320, 330 are coupled to be a first inverter, and the transistors 322, 332 are coupled to be a second inverter. The transistors 320, 330 have a common gate electrode 340, and the transistors 322, 332 have a common gate electrode 342. The transistors 320, 322 are coupled to VDD, and the transistors 330, 332 are coupled to VSS. Drains of the transistors 320, 330 are coupled together at a node Q to a drain of the access transistor 310 and to the gate electrode 342. The node Q is a body of semiconductor material connected to the transistors 310, 320, and 330. Similarly, drains of the transistors 322, 332 are coupled together at a complementary node QB to a drain of the access transistor 312 and to the gate electrode 340. The node QB is a body of semiconductor material connected to the transistors 312, 322, and 332. A contact on the gate electrode 340 is coupled to a contact on the node QB through a metal conductor 350, and a contact on the gate electrode 342 is coupled to a contact on the node Q through a metal conductor 352.

Figure 4:
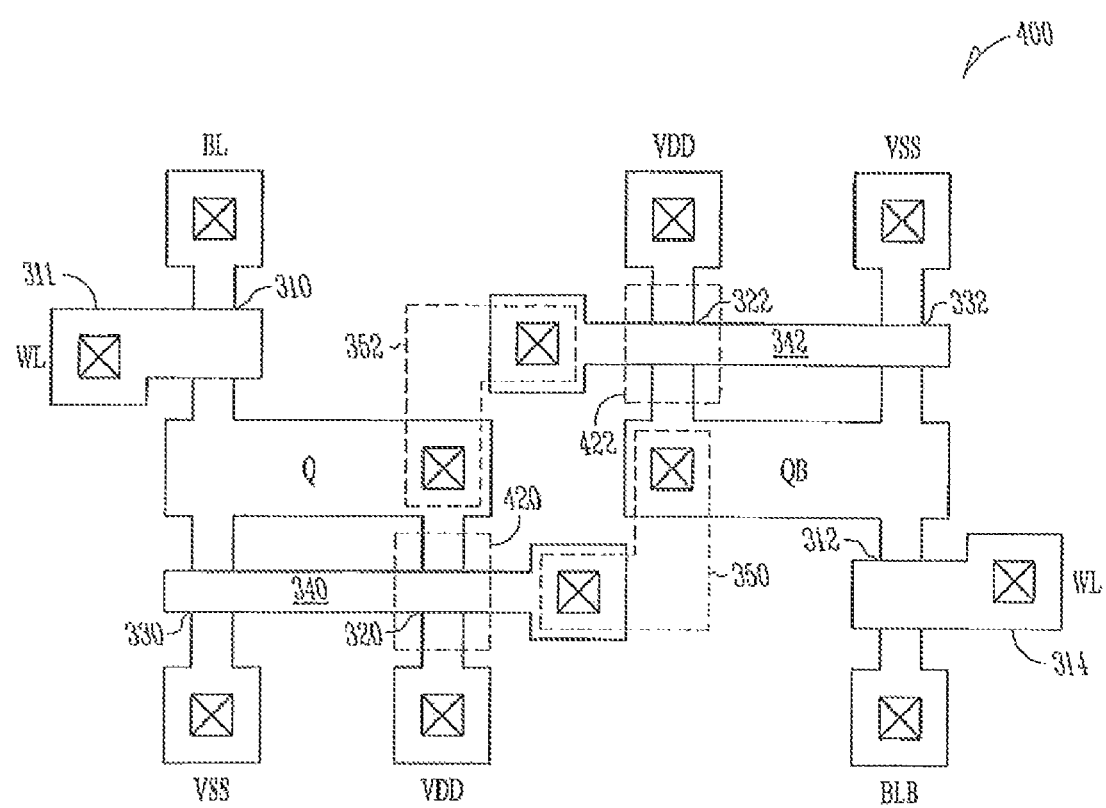
FIG. 4 illustrates a layout of a SRAM cell according to various embodiments.

FIG. 4 illustrates a layout of a SRAM cell 400 according to various embodiments. The layout of the SRAM cell 400 has the same elements as the layout of the SRAM cell 300 shown in FIG. 3, and similar elements have been given the same reference characters and will not be further described for purposes of brevity.

In the SRAM cell 400 illustrated in FIG. 4, the required performance ratio between the pull-down transistor and the access transistor is accomplished via longer gate electrodes 311 and 314. The impact of longer gate electrodes 311 and 314 is on the power dissipation, since longer gate electrodes imply a higher gate capacitance and a corresponding switching power. In this case, the impact on the circuit area is small, but the efficiency of any layout compaction procedure would be smaller.

The load transistors 320, 322 in the SRAM cell 400 receive a treatment that results in the fins of the load transistors 320, 322 having a lower charge carrier mobility than the fins of the pull-down transistors 330, 332 that do not receive the treatment. According to various embodiments, the load transistors 320, 322 in the SRAM cell 400 receive two counter-doping implantations inside two areas defined by broken lines 420, 422. The two counter-doping implantations result in the load transistors 320, 322 being weaker than the respective pull-down transistors 330, 332.

Figure 5:
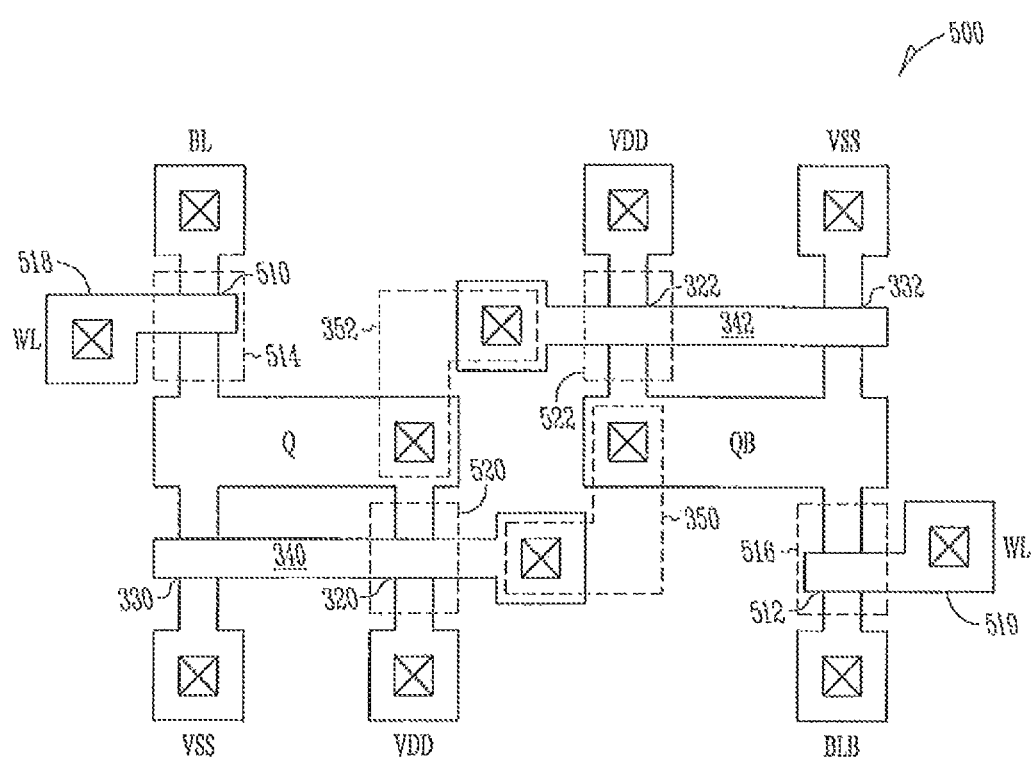
FIG. 5 illustrates a layout of a SRAM cell according to various embodiments.

FIG. 5 illustrates a layout of a SRAM cell 500 according to various embodiments. The layout of the SRAM cell 500 has the same elements as the layout of the SRAM cell 300 shown in FIG. 3, and similar elements have been given the same reference characters and will not be further described for purposes of brevity.

Access transistors 510, 512 in the SRAM cell 500 receive a treatment that results in the fins of the access transistors 510, 512 having a lower charge carrier mobility than the fins of the pull-down transistors 330, 332 that do not receive the treatment. According to various embodiments, the access transistors 510, 512 in the SRAM cell 500 receive two counter-doping implantations inside two areas defined by broken lines 514 and 516. The two counter-doping implantations result in the access transistors 510, 512 being weaker than the respective pull-down transistors 330, 332. Since the required performance ratio between the access transistors 510, 512 and the pull-down transistors 330, 332 is accomplished by a lower charge carrier mobility, the lengths of gate electrodes 518 519 of the access transistors 510, 512 can be kept smaller when compared to the corresponding elements in the SRAM cells 300, 400 illustrated in FIGS. 3 and 4. The lengths of the gate electrodes 518, 519 are smaller than the lengths of the gate electrodes 311, 314 illustrated in FIGS. 3 and 4.

In addition, the load transistors 320, 322 in the SRAM cell 500 receive a treatment that results in the fins of the load transistors 320, 322 having a lower charge carrier mobility than the fins of the pull-down transistors 330, 332. According to various embodiments, the load transistors 320, 322 in the SRAM cell 500 receive two counter-doping implantations inside two areas defined by broken lines 520, 522. The two counter-doping implantations result in the load transistors 320, 322 being weaker than the respective pull-down transistors 330, 332.

According to various embodiments, channels of the transistors in the SRAM cells 400, 500 shown in FIGS. 4 and 5 that do not receive the counter-doping have a doping concentration substantially less than the doping concentration of the channels of the transistors that receive the counter-doping. According to various embodiments, the channel of at least one of the transistors receiving the counter-doping is doped with a first dopant of a first polarity and is counter-doped with a second dopant of a second polarity opposite to the first polarity to a ratio of approximately 1:1. According to various embodiments, a concentration of the first dopant is approximately equal to a concentration of the second dopant. According to various embodiments, the first dopant is phosphorus (P) or arsenic (As) or antimony (Sb) and the second dopant is boron (B). According to various embodiments, channels of the transistors in the SRAM cells 400, 500 shown in FIGS. 4 and 5 that do not receive the counter-doping do, in fact, receive amounts of the second dopant that results in a ratio of the first dopant to the second dopant in these fins being greater than 10:1.

According to various embodiments, the load transistors 320, 322 and the access transistors 310, 312, 510, 512 in the SRAM cells 400, 500 do not receive the same treatment. The transistors 310, 312, 320, 322, 510, 512 may each receive different dopant concentrations, or some of the transistors 310, 312, 320, 322, 510, 512 may receive counter-doping, some of the transistors 310, 312, 320, 322, 510, 512 may not receive a treatment, and others of the transistors 310, 312, 320, 322, 510, 512 may be treated by other methods to reduce charge carrier mobility as described below.

Other methods are available to reduce the charge carrier mobility in the fins of selected transistors in the SRAM cells 400, 500 shown in FIGS. 4 and 5. For example, fins of one or more selected transistors in the SRAM cells 400, 500 include interstitials to reduce charge carrier mobility according to various embodiments. Fins of one or more selected transistors in the SRAM cells 400, 500 include an electrically non-active material to reduce charge carrier mobility according to various embodiments. The electrically non-active material is selected from one or more of germanium (Ge) and carbon (C). Fins of one or more selected transistors in the SRAM cells 400, 500 include additional surface states to reduce charge carrier mobility according to various embodiments. The additional surface states may be formed by implants to damage a surface of the fins of the selected transistors.

Figure 6:
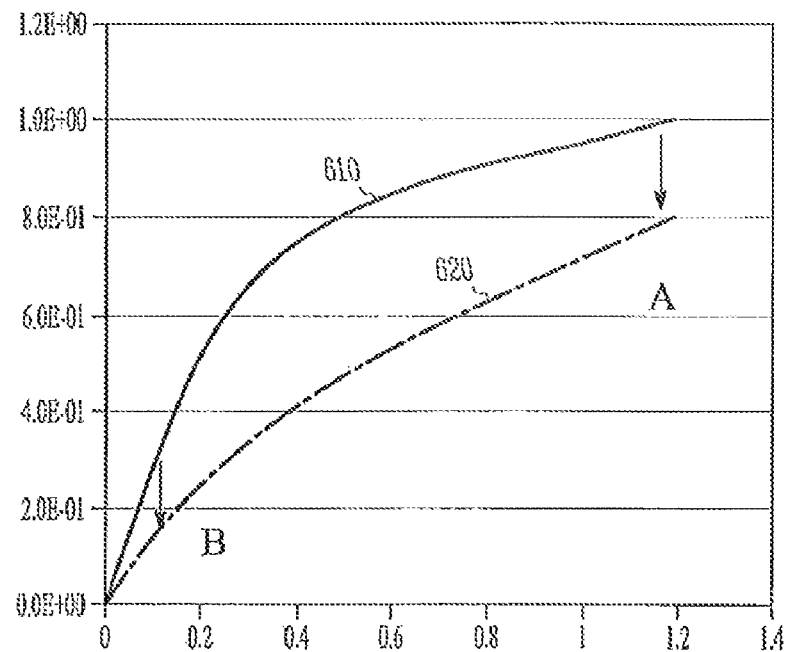
FIG. 6 illustrates characteristic curves of two single-fin field effect transistors according to various embodiments.

FIG. 6 illustrates characteristic curves 610, 620 of two single-fin field effect transistors at Ugs=1.2V according to various embodiments. The transistor with a higher mobility has no channel doping and has the characteristic curve 610, whereas the transistor with the lower mobility received 2 implantations with dopant species of opposite polarity, also called counter-doping, and has the characteristic curve 620. The reduced mobility leads to a reduction of saturation and linear currents indicated by arrows at A and B, respectively. In the linear region, the decreased mobility reduces current on a relative scale, compared with the saturation region. The load transistors 120, 122 receive two counter-doping implantations and have the characteristic curve 620 according to various embodiments.

FinFET transistors are candidates for high-k/metal-gate technologies, where a gate dielectric and a gate electrode includes a high-k dielectric and a metal, respectively. With such a gate stack, a channel of a FinFET needs no doping to adjust its threshold voltage. Instead, the threshold voltage is adjusted by an appropriate choice of the metal with a corresponding work function. Any of the embodiments described herein introduce dopants of both polarities into the channels of FinFETs, which have to be weaker compared to other transistors within a circuit such as a SRAM cell. According to various embodiments, concentrations of the dopants of both polarities are nearly identical.

Figure 7:
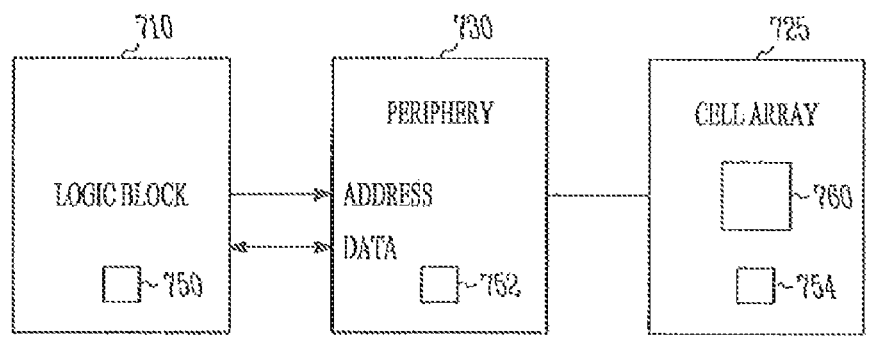
FIG. 7 illustrates a block diagram of a system according to various embodiments.

FIG. 7 illustrates a block diagram of a system 700 according to various embodiments. The system 700 includes a logic block 710 that is coupled to access a memory array 725 through a periphery circuit 730. The logic block 710 may be any type of logic device such as a microprocessor. The logic block 710, the array 725, and the periphery circuit 730 each may include a respective transistor 750, 752, 754 according to any of the embodiments described herein. The array 725 may include a SRAM cell 760 according to any of the embodiments described herein. The array 725 may be a SRAM cell array including an array of SRAM cells according to any of the embodiments described herein. The logic block 710, the array 725, and the periphery circuit 730 each may be fabricated in a separate integrated circuit, or two or more of the logic block 710, the array 725, and the periphery circuit 730 may be fabricated in a single integrated circuit.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments of the invention. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims.

In addition, in the foregoing Detailed Description, it can be seen that various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment.

Thus the following claims are hereby incorporated into the Detailed Description, with each claim standing on its own as a separate preferred embodiment. The terms "first," "second," and "third," etc. are used merely as labels, and are not intended to impose numerical requirements on their objects.

What is claimed is:

1. A method comprising:
   treating a fin of a first n-channel access transistor in a static random access memory cell to have a lower charge carrier mobility than a fin of a first n-channel pull-down transistor in a first inverter in the memory cell, the first n-channel access transistor being coupled between a first bit line and a first node of the first inverter; and
   treating a fin of a second n-channel access transistor in the memory cell to have a lower charge carrier mobility than a fin of a second n-channel pull-down transistor in a second inverter in the memory cell, the second n-channel access transistor being coupled between a second bit line and a second node of the second inverter.

2. The method of claim 1 wherein:
   treating a fin of a first n-channel access transistor includes implanting a channel in the fin of the first n-channel access transistor with a first dopant of a first polarity and with a second dopant of a second polarity opposite to the first polarity to a ratio of approximately 1:1; and
   treating a fin of a second n-channel access transistor includes implanting a channel in the fin of the second n-channel access transistor with the first dopant and with the second dopant to a ratio of approximately 1:1.

3. The method of claim 1 wherein:
   treating a fin of a first n-channel access transistor includes implanting the fin of the first n-channel access transistor with interstitials to reduce charge carrier mobility; and
   treating a fin of a second n-channel access transistor includes implanting the fin of the second n-channel access transistor with interstitials to reduce charge carrier mobility.

4. The method of claim 1 wherein:
   treating a fin of a first n-channel access transistor includes forming the fin of the first n-channel access transistor with electrically non-active material to reduce charge carrier mobility; and
   treating a fin of a second n-channel access transistor includes forming the fin of the second n-channel access transistor with electrically non-active material to reduce charge carrier mobility.

5. The method of claim 1 wherein:
   treating a fin of a first n-channel access transistor includes implanting to damage a surface of the fin of the first n-channel access transistor to reduce charge carrier mobility; and
   treating a fin of a second n-channel access transistor includes implanting to damage a surface of the second n-channel access transistor to reduce charge carrier mobility.

6. The method of claim 1, further comprising:
   treating a fin of a first p-channel load transistor in the memory cell to have a lower charge carrier mobility than a fin of the first n-channel pull-down transistor, the first p-channel load transistor being coupled between a supply voltage and the first node in the first inverter; and
   treating a fin of a second p-channel load transistor in the memory cell to have a lower charge carrier mobility than a fin of the second n-channel pull-down transistor, the second p-channel load transistor being coupled between the supply voltage and the second node in the second inverter.

7. The method of claim 6 wherein:
   treating a fin of a first p-channel load transistor includes implanting a channel in the fin of the first p-channel load transistor with a first dopant of a first polarity and with a second dopant of a second polarity opposite to the first polarity to a ratio of approximately 1:1; and
   treating a fin of a second p-channel load transistor includes implanting a channel in the fin of the second p-channel load transistor with the first dopant and with the second dopant to a ratio of approximately 1:1.

8. The method of claim 6 wherein:
   treating a fin of a first p-channel load transistor includes implanting the fin of the first p-channel load transistor with interstitials to reduce charge carrier mobility; and
   treating a fin of a second p-channel load transistor includes implanting the fin of the second p-channel load transistor with interstitials to reduce charge carrier mobility.

9. The method of claim 6 wherein:
   treating a fin of a first p-channel load transistor includes forming the fin of the first p-channel load transistor with electrically non-active material to reduce charge carrier mobility; and
   treating a fin of a second p-channel load transistor includes forming the fin of the second p-channel load transistor with electrically non-active material to reduce charge carrier mobility.

10. The method of claim 6 wherein:

treating a fin of a first p-channel load transistor includes implanting to damage a surface of the fin of the first p-channel load transistor to reduce charge carrier mobility; and treating a fin of a second p-channel load transistor includes implanting to damage a surface of the second p-channel load transistor to reduce charge carrier mobility.

* * * * *